(12) United States Patent
Guidoulianov et al.

(10) Patent No.: US 10,830,845 B2
(45) Date of Patent: Nov. 10, 2020

(54) MAS-NMR ROTOR SYSTEM WITH IMPROVED SPACE UTILIZATION

(71) Applicant: Bruker BioSpin AG, Faellanden (CH)

(72) Inventors: Jevgeni Guidoulianov, Wetzikon (CH); Nicolas Freytag, Binz (CH)

(73) Assignee: BRUKER SWITZERLAND AG, Faellanden (CH)

( * ) Notice: Subject to any disclaimer, the term of this patent is extended or adjusted under 35 U.S.C. 154(b) by 107 days.

(21) Appl. No.: 16/194,907

(22) Filed: Nov. 19, 2018

(65) Prior Publication Data

US 2019/0154771 A1 May 23, 2019

(30) Foreign Application Priority Data

Nov. 20, 2017 (DE) .......................... 10 2017 220 709

(51) Int. Cl.
*G01R 33/30* (2006.01)
*G01R 33/46* (2006.01)

(52) U.S. Cl.
CPC ........... *G01R 33/307* (2013.01); *G01R 33/46* (2013.01)

(58) Field of Classification Search
CPC ....... G01R 33/30; G01R 33/307; G01R 33/46
USPC .......................................... 324/300–301, 321
See application file for complete search history.

(56) References Cited

U.S. PATENT DOCUMENTS

| | | | |
|---|---|---|---|
| 4,275,350 A | 6/1981 | Hill et al. | |
| 4,446,430 A * | 5/1984 | Stejskal | G01R 33/307 324/318 |
| 4,456,882 A * | 6/1984 | Doty | G01R 33/307 324/318 |
| 4,511,841 A * | 4/1985 | Bartuska | G01R 33/307 324/318 |
| 4,739,270 A | 4/1988 | Daugaard et al. | |

(Continued)

FOREIGN PATENT DOCUMENTS

| | | |
|---|---|---|
| CN | 1524187 A | 8/2004 |
| CN | 103176153 A | 6/2013 |

(Continued)

OTHER PUBLICATIONS

Althoff,Gerhard., Solid State NMR Hardware Probeheads, MAS Rotors, RF Filters. Bruker Biospin GmbH. www.bruker-biospin.com (Year: 2020).*

(Continued)

*Primary Examiner* — Patrick Assouad
*Assistant Examiner* — Sean Curtis
(74) *Attorney, Agent, or Firm* — Edell, Shapiro & Finnan, LLC

(57) ABSTRACT

A first radial bearing includes nozzles in the stator at a radius r1 and a bearing surface on a circular section of the rotor at a radius R1. A second radial bearing includes nozzles in the stator at a radius r2 and a bearing surface on the rotor at a radius R2. An axial bearing includes a nozzle in the stator and a bearing surface on an axial end of the rotor, which runs orthogonally to the rotation axis and has an outer radius R3. The second radial bearing is formed on an end section of the rotor, which has a smaller radius than or a radius that decreases away from the circular section, so that R2<R1 and r2<r1. The third bearing surface is formed on an end of the end section facing away from the circular section, so that R3≤R2.

19 Claims, 4 Drawing Sheets

(56) References Cited

U.S. PATENT DOCUMENTS

| | | | |
|---|---|---|---|
| 4,806,868 A | 2/1989 | Schulke | |
| 4,940,942 A | 7/1990 | Bartuska et al. | |
| 5,202,633 A * | 4/1993 | Doty | G01R 33/307 324/321 |
| 5,289,130 A * | 2/1994 | Doty | G01R 33/307 324/307 |
| 5,325,059 A * | 6/1994 | Doty | G01R 33/307 324/321 |
| 5,333,994 A * | 8/1994 | Doty | G01R 33/307 415/200 |
| 5,508,615 A * | 4/1996 | Doty | G01R 33/307 324/318 |
| 5,644,235 A * | 7/1997 | Baltusis | G01R 33/307 324/321 |
| 5,729,142 A * | 3/1998 | Baltusis | G01R 33/307 324/321 |
| 5,760,586 A * | 6/1998 | Foerster | G01R 33/307 324/318 |
| 6,054,857 A | 4/2000 | Doty | |
| 6,130,537 A * | 10/2000 | Doty | G01R 33/307 324/318 |
| 6,320,384 B1 * | 11/2001 | Doty | G01R 33/34053 324/321 |
| 6,803,764 B2 * | 10/2004 | Hioka | G01R 33/307 324/318 |
| 6,836,115 B2 | 12/2004 | Wind et al. | |
| 7,081,753 B2 * | 7/2006 | Mullen | G01R 33/3635 324/318 |
| 7,170,292 B2 * | 1/2007 | Doty | G01R 33/307 324/321 |
| 7,196,521 B2 * | 3/2007 | Doty | G01R 33/307 324/318 |
| 7,282,919 B2 * | 10/2007 | Doty | G01R 33/307 324/321 |
| 7,436,181 B2 * | 10/2008 | Krahn | G01R 33/307 324/318 |
| 7,541,807 B2 * | 6/2009 | Stringer | G01R 33/307 324/307 |
| 7,915,893 B2 * | 3/2011 | Shevgoor | G01R 33/31 324/318 |
| 8,212,565 B2 * | 7/2012 | Bez | G01R 33/307 324/318 |
| 9,062,904 B2 * | 6/2015 | Doty | F17C 13/00 |
| 9,366,736 B2 * | 6/2016 | Cho | G01R 33/30 |
| 9,581,663 B2 * | 2/2017 | Endo | G01R 33/307 |
| 9,778,331 B2 * | 10/2017 | Hunkeler | G01R 33/307 |
| 9,903,923 B2 * | 2/2018 | Schett | G01R 33/307 |
| 9,945,654 B2 * | 4/2018 | Freytag | G01R 33/07 |
| 9,952,294 B2 | 4/2018 | Leskowitz | |
| 10,120,044 B2 * | 11/2018 | Purea | G01R 33/282 |
| 10,132,881 B2 * | 11/2018 | Osen | G01R 33/307 |
| 10,197,653 B2 * | 2/2019 | Purea | G01R 33/34053 |
| 10,241,162 B2 * | 3/2019 | Osen | F01D 5/141 |
| 10,261,143 B2 * | 4/2019 | Freytag | G01R 33/307 |
| 10,310,032 B2 * | 6/2019 | Bouleau | F25B 9/10 |
| 10,422,839 B2 * | 9/2019 | Hassan | G01R 33/34007 |
| 10,459,044 B2 * | 10/2019 | Osen | G01R 33/307 |
| 2003/0102867 A1 * | 6/2003 | Hioka | G01R 33/307 324/321 |
| 2006/0017438 A1 * | 1/2006 | Mullen | G01R 33/3635 324/318 |
| 2006/0082371 A1 * | 4/2006 | Doty | G01R 33/307 324/321 |
| 2006/0176056 A1 * | 8/2006 | Doty | G01R 33/307 324/321 |
| 2006/0220647 A1 * | 10/2006 | Doty | G01R 33/307 324/321 |
| 2007/0030005 A1 * | 2/2007 | Krahn | G01R 33/34046 324/321 |
| 2009/0021260 A1 * | 1/2009 | Stringer | G01R 33/307 324/321 |
| 2010/0026302 A1 * | 2/2010 | Doty | G01R 33/34015 324/318 |
| 2011/0101981 A1 * | 5/2011 | Bez | G01R 33/307 324/318 |
| 2013/0307543 A1 * | 11/2013 | Endo | G01R 33/307 324/321 |
| 2013/0335079 A1 * | 12/2013 | Samoson | G01R 33/28 324/309 |
| 2014/0125340 A1 * | 5/2014 | Hunkeler | G01R 33/307 324/321 |
| 2014/0167756 A1 * | 6/2014 | Cho | G01R 33/307 324/309 |
| 2014/0216080 A1 * | 8/2014 | Doty | F17D 1/082 62/95 |
| 2016/0195593 A1 * | 7/2016 | Purea | G01R 33/345 324/322 |
| 2016/0334478 A1 * | 11/2016 | Osen | G01R 33/302 |
| 2017/0108561 A1 * | 4/2017 | Osen | F01D 5/02 |
| 2017/0146621 A1 * | 5/2017 | Freytag | G01R 33/4641 |
| 2017/0248404 A1 * | 8/2017 | Freytag | G01R 33/38 |
| 2018/0003782 A1 * | 1/2018 | Hassan | G01R 33/34046 |
| 2018/0088190 A1 * | 3/2018 | Osen | G01R 33/307 |
| 2019/0154770 A1 * | 5/2019 | Freytag | G01R 33/3403 |
| 2019/0154771 A1 * | 5/2019 | Guidoulianov | G01R 33/46 |
| 2019/0302207 A1 * | 10/2019 | Purea | G01R 33/46 |

FOREIGN PATENT DOCUMENTS

| | | | | |
|---|---|---|---|---|
| CN | 105408970 | A | 3/2016 | |
| CN | 107121651 | A | 9/2017 | |
| DE | 102013201110 | B3 | 4/2014 | |
| DE | 112005002582 | B4 * | 12/2015 | G01R 33/307 |
| DE | 202015105448 | U1 | 1/2017 | |
| EP | 3093679 | A1 * | 11/2016 | G01R 33/44 |
| JP | S58039938 | A | 3/1983 | |
| JP | S61036613 | A | 8/1986 | |
| JP | H01155252 | A | 6/1989 | |
| JP | H08014618 | A | 1/1996 | |
| JP | H080077168 | A | 3/1996 | |
| JP | 2011529562 | A | 12/2011 | |
| JP | 2018081079 | A * | 5/2018 | G01R 33/31 |
| JP | 2019109227 | A * | 7/2019 | G01R 33/46 |
| WO | WO-2006043221 | A2 * | 4/2006 | G01R 33/307 |
| WO | WO-2006043221 | A3 * | 4/2007 | G01R 33/307 |

OTHER PUBLICATIONS

Thurber K R et al., "Biomolecular solid state NMR with magic-angle spinning at 25 K", Journal of Magnetic Resonance, Sep. 23, 2008, pp. 179-186.

\* cited by examiner

MAS-NMR ROTOR SYSTEM WITH IMPROVED SPACE UTILIZATION

CROSS REFERENCE TO RELATED APPLICATIONS

This application claims foreign priority under 35 U.S.C. § 119(a)-(d) to German Application No. DE 10 2017 220 709.4 filed on Nov. 20, 2017, the entire contents of which are hereby incorporated into the present application by reference.

FIELD OF THE INVENTION

The invention relates to a MAS-NMR rotor system, comprising a rotor for accommodating a measurement substance and a stator for mounting the rotor so as to be rotatable about a rotation axis,
having a first pneumatic radial bearing, comprising first nozzle outlet openings in the stator at a radius r1 and a first bearing surface on a circular cylindrically-shaped section of the rotor at a radius R1, having a second pneumatic radial bearing, comprising second nozzle outlet openings in the stator at a radius r2 and a second bearing surface on the rotor at a radius R2,
and having a pneumatic axial bearing, comprising at least one nozzle outlet opening in the stator and a third bearing surface on an axial end of the rotor, wherein the third bearing surface extends orthogonally to the rotation axis and has an outer radius R3.

BACKGROUND

Such a system became known, for example, from US 2016/0334478 A1.

Nuclear magnetic resonance (NMR)-spectroscopy is an efficient analysis method, with which the chemical composition of measurement substances (samples) may be investigated. In this method, the measurement substance is exposed to a strong static magnetic field, resulting in the alignment of nuclear spins in the measurement substance. After being irradiated with radio frequency (RF) pulses, RF signals emitted from the measurement substance are received and evaluated for determining the chemical composition.

During NMR spectroscopy of solid samples, a significant line broadening occurs in measured NMR spectra due to anisotropic interactions between nuclei in the sample. For solid samples, it is known to rotate the measurement substance during the NMR measurement at the so-called "magic angle" of approximately 54.7° (MAS: "magic angle spinning") with respect to the direction of the static magnetic field. This may reduce or, in the case of sufficiently high rotation frequencies, eliminate a line broadening as a result of dipolar interactions, quadrupole interactions and as a result of the anisotropic part of the chemical shift.

For this purpose, the measurement substance is typically introduced into an essentially cylindrical test tube, called a rotor, and passed into a stator. The rotor is set to rotate relative to the stator, wherein the rotor floats in the stator. For this purpose suitable gas flows are used. In order to irradiate RF pulses into the measurement substance and/or to receive RF signals from the measurement substance, a RF coil arrangement is provided, which surrounds the stator.

A NMR-MAS probe head having a rotor and stator became known from US 2016/0334478 A1, wherein two pneumatic radial bearings and a bottom bearing are formed. A RF coil arrangement may be situated between the portions of the radial bearing on the stator side. The rotor is cylindrical, having identical radii on both radial bearings. The nozzle outlet openings in the stator also have the same radius on both radial bearings. A similar arrangement became known from DE 10 2013 201 110 B3.

The rotor and the RF coil arrangement in this NMR-MAS probe head are located in the same environment at room temperature. The RF coil arrangement may be cooled in order to improve the signal-to-noise ratio of the NMR measurement. In order to achieve a sufficient cooling, the RF coil arrangement should be provided for this purpose with an insulation, for example, a vacuum insulation. A similar design is advantageous when measuring measurement samples at very high temperatures, in which the measuring chamber may be thermally separated from the RF coil arrangement, for example, by a vacuum insulation.

However, such an insulation increases the radial distance between the rotor, respectively, the measurement substance and the RF coil arrangement. For this reason, a RF coil arrangement having a larger diameter must be selected, even though only a relatively small portion of the rotor is filled with sample substance. Furthermore, the RF coil arrangement must be insulated axially with respect to the stator which, in the case of radial bearing parts that extend radially on the stator side, shortens the coil length and thus reduces the measurement volume given the same measurement sample volume. In a design of this type, the losses in performance due to the geometric drawbacks would largely nullify or even exceed the gains achievable by the noise reduction due to the lowered temperature of the RF coil arrangement. Moreover, it is difficult to later install such an insulation in a MAS NMR probe head.

A rotor system having two radial bearings of identical radii and a conical bottom bearing, which receives a diagonal gas flow, became known from U.S. Pat. No. 7,196,521. Rotor systems having a radial bearing and a conical drive became known from U.S. Pat. Nos. 4,275,350 and 4,806,868. U.S. Pat. No. 4,739,270 describes a rotor system having two radial bearings of identical radii and having a constriction at the end as a marking for the spinning detection. U.S. Pat. Nos. 5,325,059 and 5,508,615 show rotor systems, wherein the rotor includes terminal constrictions on which a drive operates; the mounting takes place using two radial bearings of equal-sized diameter. In U.S. Pat. No. 6,054,857, a drive is achieved via caps constricted at the end. In U.S. Pat. No. 6,803,764, one end of the rotor includes a constriction at which the drive operates; mounting is achieved with two radial bearings of equal-sized diameter and a bottom bearing.

SUMMARY

It is an object of the invention to provide a MAS-NMR rotor system, with which a RF coil arrangement is able to move radially particularly close to a measurement substance in the rotor and the MAS-NMR coil arrangement is easily moved into and out of the RF coil arrangement, in particular, wherein the RF coil arrangement may be easily fitted with an insulation.

This object is achieved, according to one formulation and in a surprisingly simple and effective manner by a rotor system of the aforementioned kind, which is characterized in that the second radial bearing is formed on an end section of the rotor which, compared to the circular cylindrically-shaped section, has a smaller radius or a radius that decreases away from the circular cylindrically-shaped section, so that R2<R1 applies and also r2<r1, and that the third bearing surface is formed on an end section that faces away from the circular cylindrically-shaped section, so that R3≤R2 also applies.

According to the invention, it is provided that the rotor is constricted relative to the circular cylindrically-shaped section in the area of the end section where the second radial bearing is formed, corresponding to R2<R1. As a result, a radial space is provided for forming the portion of the second radial bearing on the stator side. Accordingly, the second radial bearing may be more narrowly formed on the stator side than the first radial bearing, in accordance with r2<r1.

The MAS-NMR rotor system according to the invention, comprising a rotor and a stator, may then be formed radially narrower at one end (in front, in the area of the second pneumatic radial bearing) than at the other end (in the rear, in the area of the first pneumatic radial bearing). As a result, the rotor system may be easily introduced with the front end (i.e., with the front end section and portions of the circular cylindrically-shaped section) into a radially limited space, into which the rear end (having the first pneumatic radial bearing) would no longer fit.

The geometry according to the invention makes it possible for a RF coil arrangement (a RF coil system), into which the stator and the rotor are introduced in the axial direction, to move very close to the rotor and to the measurement substance. The useable volume for the measurement substance in the interior of the coil arrangement is determined not by the radial width of the first pneumatic radial bearing acting on the cylindrical section, but only by the radial width of the second pneumatic radial bearing situated at the radially smaller end section (or by the circular cylindrically-shaped section itself, if the latter has a larger radial width). On the whole, a very compact design of the rotor system is possible.

If the rotor system is inserted axially into a RF coil arrangement, it is in general easily possible to exchange (potentially also retrofit) the rotor system into this RF coil arrangement. The stator may, in particular, be manipulated (for example pushed in or pulled out) without having to remove the RF coil arrangement from the probe head (also referred to as probe head assembly). An insulation, such as a vacuum insulation, for the RF coil arrangement is very easy to set up in conjunction with the MAS-NMR rotor system, in particular, with an inner wall extending essentially in the axial direction at a constant inner radius. In individual cases, such an insulation can be easily retrofitted, and can be used particularly well with the inventive rotor system. A portion of the stator (for example, a sheath element) may, in particular, be utilized as a radially inner portion or wall of an insulation of a RF coil arrangement, as described in greater detail below.

A reduction of the radius R2 in the end section relative to the radius R1 in the circular cylindrically-shaped section along the axial direction may take place continuously or continuously in sections or also in one or in multiple stages. The transition from the circular cylindrically-shaped section to the end section may also take place continuously or also in one stage. It should be noted that the second bearing surface may run in parallel to the rotation axis, or also at a tapered angle to the rotation axis; the second radial bearing (and also the first radial bearing) holds the rotor in position in the radial direction. The radius R1 of the bearing surfaces relates to the position in the center relative to the associated nozzle outlet openings; in the case of multiple nozzle outlet openings at various axial positions, the radius of the bearing surfaces relates to a center axial position of the nozzle outlet openings. The same applies for the radii $r_i$ One preferred embodiment of the rotor system according to the invention provides that the end section is at least partially circularly cylindrical in design. This enables a particularly simple design on the stator side. In addition, the radial bearing function of the second radial bearing and the axial bearing function of the axial bearing may be adjusted separately from one another, if the second radial bearing is furnished in the circular cylindrical area of the end section. The end section may be designed as a complete circular cylinder, with a (rectangular) stage at the transition to the circular cylindrically-shaped section. In one advantageous construction, the end section includes a truncated conically-shaped portion (area) toward the circular cylindrically-shaped end section and a circular cylindrically-shaped portion (area) toward the axial bearing.

In another embodiment, the end section is designed at least partially in a truncated conically-shaped manner. This enables a simple and high-volume design of the rotor. The end section may, in particular, be designed completely in a truncated conically-shaped manner. If the second radial bearing is formed in the truncated conically-shaped area of the end section, the second radial bearing, in addition to the axial bearing, may contribute to the axial bearing function. Moreover, the introduction of the rotor into the stator may be facilitated by the truncated conically-shaped profile of the rotor, which acts as a guide. In addition, the fracture tendency under operating loads of the rotor is reduced for a conical transition compared to a right-angled shoulder, for example with a completely circular cylindrical end section.

A refinement of this embodiment is preferred, wherein the end section extends at least partially at an angle α relative to the rotation axis, where 15°≤α≤45°. This angular range for a truncated conically-shaped end section (or a truncated conically-shaped portion of the end section) is proven in practice, in particular, in order to achieve a sufficient radial bearing function.

Another advantageous embodiment provides that the stator encloses the third bearing surface and at least an adjacent portion of the end section, preferably, the entire end section, in a cup-shaped manner, wherein air outlets are provided in the stator in the area of the third bearing surface and/or in the area of the end section. This allows the gas flow (in particular, for the radial and axial bearing function) to be particularly easily controlled, and high rotational speeds of the rotor may also be adjusted and reliably controlled.

In one preferred embodiment, it is provided that the end section extends over ¼ of the length of the rotor or less and/or at least over ½₀ of the length of the rotor. If the rotor has a sealing cap or also a cap attachment, these are included as part of the rotor in the determination of the length of the rotor. By extending the end section to ¼ the length of the rotor or less, the circular cylindrically-shaped section is correspondingly long, and the volume available for the measurement substance may be selected to be very large. By extending the end section to at least ½₀ of the length, it is possible to achieve a good mechanical stability and, in particular, a high rotational speed.

Additional Embodiments

Also preferred is an embodiment, in which the rotor includes an opening on an end that faces away from the third bearing surface for filling the rotor with measurement substance, and the rotor includes a cap, which seals the opening of the rotor. The rotor may be filled with measurement substance through the opening, and may be easily sealed by the cap (which is made usually of a plastic). Because the cap is provided at the rear (facing away from the third bearing surface) end, the cap may utilize the comparatively large radius R1, which facilitates the design and the introduction of the cap. It should be noted that a cap may alternatively also be provided for sealing the rotor in the area of the third bearing surface, or the rotor may, for example, also be flame-sealed (as a result of which a cap for sealing is not needed).

In one preferred refinement of this embodiment, counter structures, in particular, impact surfaces or wing surfaces or spiral grooves, are formed on the cap for a pneumatic drive of the rotor. The counter structures for a pneumatic drive are particularly easy to introduce into the cap; the cap performs the dual function (seal and drive). The pneumatic drive is achieved typically via a gas flow adjustable separately from the pneumatic bearings, with its own gas outlet openings (nozzles).

Also preferred is a refinement, in which an outer radius R4 of the cap corresponds essentially to the radius R1. This contributes to a compact construction. It is further advantageous if the outer radius R4<R1. In this embodiment, the momentum transfer to fins or impact surfaces may be maximized, since it is possible to achieve a higher differential velocity between the impact surfaces and the flow velocity of the drive gas.

Also advantageous is a refinement, in which the circular cylindrically-shaped section extends from the end section to the opening. In this way, a movement for the measurement substance close to the RF coil arrangement may be achieved in the case of high volume.

Also advantageous is an embodiment, in which the rotor is closed in the area of the third bearing surface. As a result, the shape of the rotor in this area is simple and precisely definable, which facilitates the adjustment of the (primarily axial) bearing forces. This is advantageous, in particular, in order to ensure the orthogonality of the axial bearing surface in relation to the rotation axis. If desired, the third bearing surface may also be formed on a cap attachment, which is fastened on the front end of the rotor; this cap attachment may also include impact surfaces or wing surfaces or spiral grooves for a pneumatic drive. Alternatively, an (alternative or additional) opening and an (alternative or additional) cap, in which the axial bearing surface is integrated, may also be provided at this end. This (alternative or additional) cap may also include impact surfaces or wing surfaces and/or spiral grooves for a pneumatic drive. For a cap or a cap attachment having outer radius R5, R5≤R2 preferably applies.

An embodiment is also particularly preferred, which provides that the rotor system also includes a counter bearing, which is situated opposite the axial bearing. The counter bearing may, for example, be designed
- as a pneumatic axial bearing, in particular, having at least one nozzle outlet in the stator and having a fourth bearing surface on an axial end of the rotor, which extends orthogonally to the rotation axis,
- as a pneumatic cone bearing,
- as a bearing based on a passive counter-pressure build-up, in particular, having a plug or a diaphragm,
- as a bearing based on an active counter-pressure build-up, in particular, having a movable plug, variable diaphragm or having air blow with no bearing surface.

It should be noted that the axial bearing typically applies a holding force (i.e., draws the front end of the rotor to the stator), whereas the counter bearing typically applies a counterforce (i.e., forces the rear end of the rotor away from the stator), in order to support the axial bearing, in particular, if the outer radius R3 is intended to be rather small, in particular, if R3≤¾×R1 or even R3≤½×R1. For small R1, the holding force at R3≤R1 may already be too small to hold the rotor in its full operating area in the stator.

MAS-NMR Probe Head Arrangements According to the Invention

Falling within the scope of the present invention is also a probe head assembly comprising a rotor system according to the invention described above, as well as a RF coil arrangement for irradiating RF pulses into the measurement substance in the rotor and/or for receiving RF signals from the measurement substance in the rotor, wherein the stator includes a first bearing base comprising a portion of the first radial bearing on the stator side, a sheath element and a second bearing base comprising a portion of the second radial bearing on the stator side, wherein the sheath element connects the first bearing base and the second bearing base to one another, wherein the sheath element includes a front section that connects to the second bearing base and has a maximum outer diameter ADV, and the second bearing base has a maximum outer diameter AD2, and the stator has a maximum outer diameter AD1 in the area of the first radial bearing, and wherein the RF coil arrangement has a minimum inner diameter IDS, where AD1>IDS and ADV<IDS and AD2<IDS.

The stator may be pushed into the RF coil arrangement or pulled out of the RF coil arrangement in the axial direction during the mounting of the probe head assembly or for maintenance purposes, without having to remove the RF coil arrangement from the probe head assembly, and wherein the largest portion of the rotor or of the measurement substance contained therein may be moved radially very close to the RF coil arrangement. The front section typically has a length LV, where LV≥0.5×LS or also LV≥1.0×LS, where LS is the length of the RF coil arrangement (in the case of multiple nested coil sections relative to an innermost coil section). The stator typically protrudes into the RF coil arrangement to directly in front of the first radial bearing. Typically, ADV=AD2 applies; in this way an optimal utilization of space may usually be achieved. However, ADV<AD2 may also be provided, for example, if one wishes to create a distance during operation between the RF coil arrangement and the sheath element and the sheath element does not encompass the second bearing base; for this purpose, the sheath element may, in particular, be glued or soldered in connection with the second bearing basis or both may be manufactured together from a single piece. Furthermore, ADV>AD2 may also be provided, in particular, if the sheath element encompasses the second bearing base.

One embodiment of the probe head assembly according to the invention is particularly preferred, in which the sheath element is gas-tight. In this way, the sheath element may assist in guiding gas flows on the rotor or also in establishing gas chambers separate from one another in order to establish optimized conditions for MAS-NMR measurements. The rotor may, in particular, be temperature-controlled independently of the RF coil arrangement; for example, the rotor, respectively, the measurement substance may be cooled. Moreover, for measurements with hazardous measurement substances, the volume in the stator and the gases that may come into contact with the hazardous measurement substances may be separated and, in particular, extracted from the rest of the laboratory and from the probe head.

One refinement of this embodiment is preferred, which provides that the RF coil arrangement is situated in an evacuated space, which is also delimited by the sheath element, and/or the RF coil arrangement is cooled to a cryogenic temperature T, in particular, where T≤100 K, preferably T≤40 K or even T≤20 K. The sheath element then serves not only as a structural component that connects the bearing bases to one another in order to make the stator manageable as a whole, but (in the inserted state) also as a partition wall for the evacuated space. In this way, a particularly compact design in the radial direction may be achieved. By cooling the RF coil arrangement, it is possible to improve the signal-to-noise ratio in the measured NMR spectrum.

Uses According to the Invention

Finally, also falling within the scope of the invention, is a use of a rotor system according to the invention described above, or of a probe head assembly according to the invention described above, for measuring a measurement substance, which is introduced into the rotor, in a MAS-NMR experiment, wherein the rotor is situated in the stator and the rotor rotates about the rotation axis, preferably at a frequency of at least 1 kHz and particularly preferably at a frequency of less than 10 kHz. The rotor and the stator of the MAS-NMR rotor system may be simply introduced along the rotation axis, and the measurement substance may be moved radially close to the RF coil arrangement. The NMR experiment may then be measured with high signal-to-noise ratio.

In one preferred variant of the use according to the invention, respective gas flows are selected, in particular to differ from one another, on the first and second radial bearings, so that an approximately equal bearing stiffness of both radial bearings is obtained. In this way, a very stable rotation with a high rotational speed may be established. A different gas flow on the two radial bearings may be established as a result of different gas pressures on the two radial bearings, for example, as a result of varying bearing nozzle diameters and/or nozzle lengths and/or gap dimensions, i.e., $(r1-R1)/2 \neq (r2-R2)/2$, or as a result of a different number of bearing nozzles with the same gas pressure, or with the same bearing nozzle diameters and/or nozzle lengths and/or gap dimensions and identical number of bearing nozzles, or also as a result of a combination of these variants. A different gas pressure on the two bearings may be achieved either by increasing or decreasing the respective pressures from the various pressure sources. It is equivalently possible to adjust the surface characteristics of the radial bearings, for instance by varying the number/volume of grooves or porosity/pore sizes on the respective bearing surfaces.

Additional advantages of the invention result from the description and from the drawing. The aforementioned features and the features explained in further detail may, according to the invention, also be used each individually per se or in multiple arbitrary combinations. The embodiments shown and described are not to be understood as an exhaustive enumeration, but rather are exemplary in character for the description of the invention.

BRIEF DESCRIPTION OF THE DRAWINGS

The invention is depicted in the drawing and is explained in greater detail with reference to exemplary embodiments, in which.

DETAILED DESCRIPTION

Figure 1:
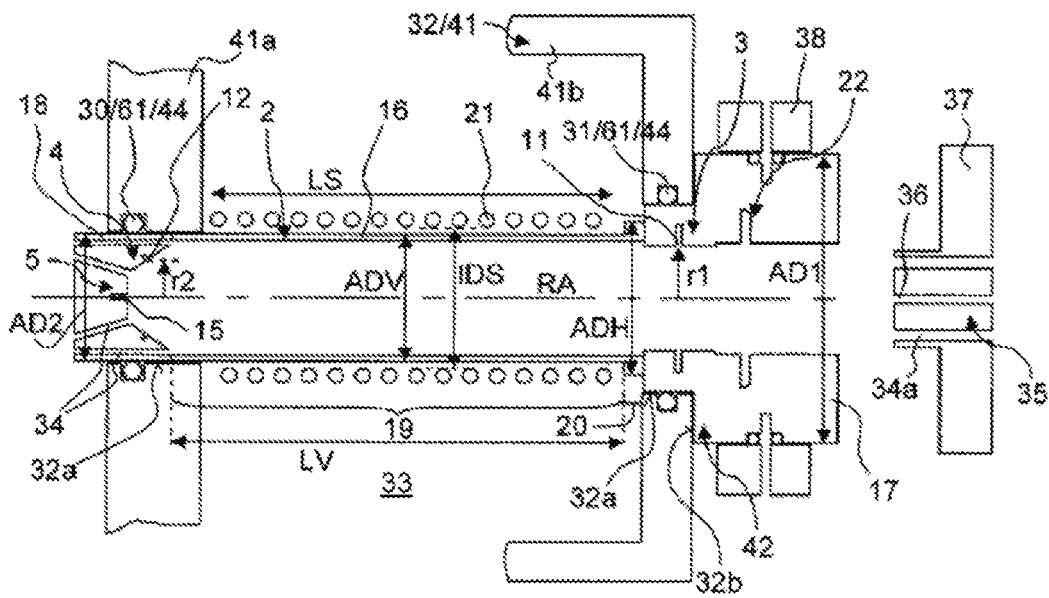
FIG. 1 schematically shows a cross section of a first embodiment of a MAS-NMR rotor system according to the invention, having a truncated conical-shaped front end section. The rotor comprises a sheath element, an axial bearing, two radial bearings and a counter bearing. The drive is formed on the side opposite the axial bearing. The embodiment depicted herein includes a fixing of the stator in the stator holder via O-rings, but beyond this no additional axial securing. Also depicted is an RF coil arrangement consisting of a wire coil.
Figure 1:
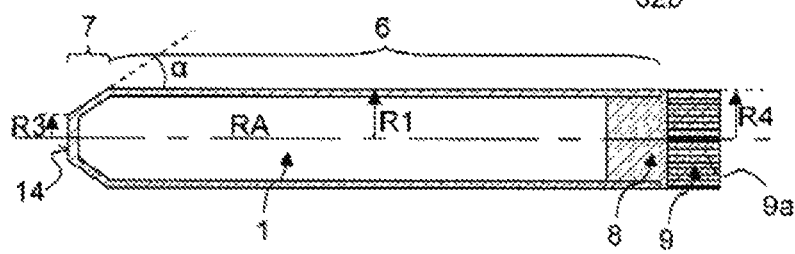
Figure 1:
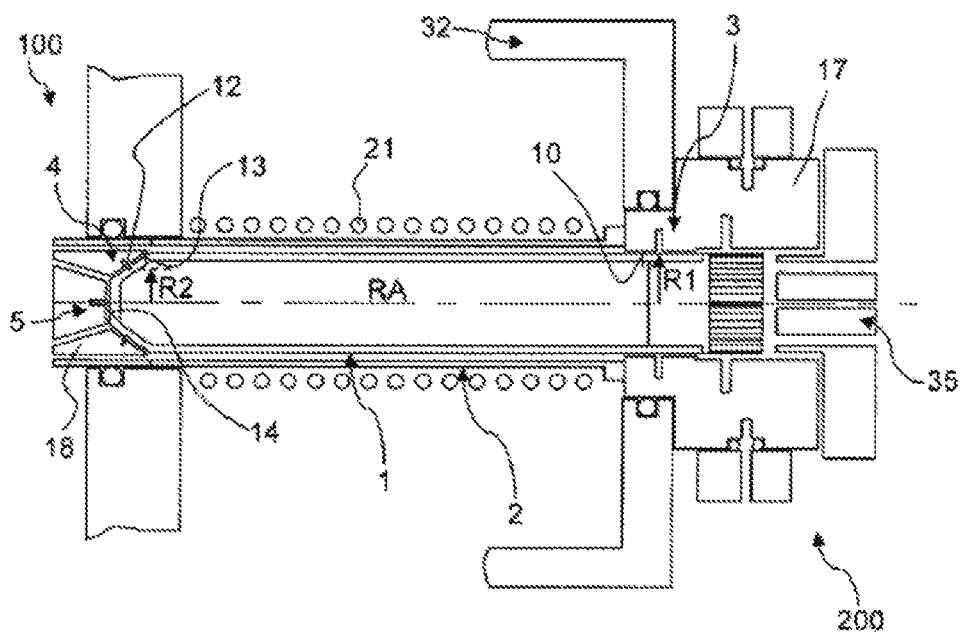

FIG. 1 shows a first embodiment of a MAS-NMR rotor system 100 according to the invention, comprising a rotor 1, in which a measurement substance in solid or semi-solid form (for example, a powder or gel) is situated, and a stator 2. The stator 2 (together with portions of a stator holder 32) is shown in the upper portion of FIG. 1, the rotor 1 in the middle in FIG. 1, and the entire MAS-NMR rotor system 100 with rotor 1 and stator 2 (together with portions of the stator holder 32) are shown in the lower portion of FIG. 1. The MAS-NMR rotor system 100 and the stator holder 32 are part of a probe head assembly 200 according to the invention.

The stator 2 comprises a first pneumatic radial bearing 3, a second pneumatic radial bearing 4 and a pneumatic axial bearing 5. The rotor 1 is mounted so as to be rotatable about a rotation axis RA inside the stator 2.

The rotor 1 comprises a circular cylindrically-shaped section 6 and an end section 7, which forms the closed end of the rotor 1 on the left (front) side in FIG. 1. The end section 7 in this case extends in a truncated conical manner and tapered toward the end on the left side; a conical angle α of the end section 7 with respect to the rotation axis RA in this case is approximately 30°; preferably is generally 10° to 45°. An opening 8 is formed on the right side (rear) end of the rotor 1, which is sealed with a cap 9, so that measurement substance introduced into the rotor 1 is not lost during a NMR experiment. Counter structures 9a, for example, impact surfaces, are formed on the cap 9 (only schematically indicated), via which, with a suitable gas flow of a pneumatic drive 22, the rotor 1 may be caused to rotate about the rotation axis RA. The outer radius R4 of the cap 9 is approximately equal to the radius R1 of the rotor 1 in the circular cylindrically-shaped section 6.

The circular cylindrically-shaped section 6 includes the (outer) radius R1, and forms a first bearing surface 10 for the first pneumatic radial bearing 3. Nozzle outlet openings 11 on the stator side (at the inner end of the nozzle outlet bore) of the first radial bearing 3 are situated on a radius r1 with respect to the rotation axis RA.

The second pneumatic radial bearing 4 has nozzle outlet openings 12 at a radius r2. The radius r2 is significantly smaller than r1, in this case where approximately r2=0.65×r1. The radius R2 on the end section 7 opposite the nozzle outlet openings 12, where a second bearing surface 13 is formed, is significantly less than R1, in this case at approximately R2=0.65×R1. The second radial bearing 4 in this case provides not only the radial mounting of the rotor 1 in the area of the front end, but may also assist in axially holding the rotor 1 given a suitable dimensioning of the flow ratios.

At the axial end of the rotor 1, on the left (front) side, the rotor 1 forms a third bearing surface 14 which, together with a nozzle outlet opening 15, forms the pneumatic axial bearing 5. The third bearing surface 14 lies perpendicularly to the rotation axis RA and has an outer radius R3, which in turn is significantly smaller than R1, in this case where R3=0.5×R1.

The portions of the second radial bearing 4 and of the axial bearing 5 on the stator side encompass the third bearing surface 14 in a cup-shaped manner and in this case also the remaining end section 7. Exhaust outlet openings 34, in addition to the nozzle outlet openings 12, 15, are also provided in the stator 2 in order to direct the exhaust air from the axial bearing 5, from the second radial bearing 4, but also, depending on the design, at least in part from the first radial bearing 3 and, in addition, any temperature-controlled air present, to the outside. This serves to avoid or minimize a counter-pressure, which would counteract the holding force of the axial bearing 5. The end section 7 in this case extends over approximately 6.5% of the entire length of the rotor 1 (including cap 9); 5% to 25% are generally preferred.

In the embodiment depicted in FIG. 1, the portions of the second radial bearing 4 and of the pneumatic axial bearing 5 on the stator side are situated so that they extend radially approximately as far as the radius R1 of the circular cylindrically-shaped section 6. Here, r2<R1, in particular, applies. In contrast, the portions of the first radial bearing 3 on the stator side occupy a space beyond R1.

The stator 2 preferably forms a unified component, as is apparent in FIG. 1 (it is possible, however, to form the stator 2 with portions separated from one another). In addition, the stator 2 has a sheath element 16, which mechanically connects a first bearing base 17, in which the portion of the first radial bearing 3 on the stator side is formed, to a second bearing basis 18, in which the portion of the second radial bearing 4 on the stator side (and here as well, the portion of the pneumatic axial bearing 5 on the stator side) is formed. The sheath element 16 includes a front section 19, which is connected to the second bearing base 18, and has a (maximum) outer diameter ADV, as well as in this case a rear section 20, having a (maximum) outer diameter ADH, which is connected to the first bearing element 17. The (maximum) outer diameter of the first bearing base 17 is AD1, and the (maximum) outer diameter of the second bearing base 18 is AD2.

The stator 2 of the MAS-NMR rotor system 100, with the second bearing base 18 and the front section 19 of the sheath element 16, passes through a RF coil arrangement 21, which has a minimum inner diameter IDS. The front section 19 has an axial length LV, which is slightly larger than the axial length LS of the RF coil arrangement 21. The RF coil arrangement in this case is formed as a self-supporting wire coil (with no coil carrier).

The MAS-NMR rotor system 100 in this case has been pushed axially as far as the rear section 20 (in this case from the right side) into the RF coil arrangement 21. For this purpose, it is established that AD2<IDS and also ADV<IDS, wherein in this case also ADV=AD2. The rotor 1 and the measurement substance contained therein may be moved radially very close to the HF coil arrangement 21. In contrast, AD1>IDS, so that the first radial bearing 3 may be formed with a large radius r1 of the nozzle outlet openings 11, and AD1>IDS may also be established in order to improve the (rear) radial mounting of the rotor 1. It is readily possible for maintenance purposes to extract the stator 2 axially from the RF coil arrangement 21 (in this case to the right) and to re-insert into the RF coil arrangement after repair (or after replacement if required) (in this case to the left), without removing the RF coil arrangement 21 from the MAS-NMR probe head assembly 200.

If the axial bearing 5, optionally together with the retention contribution of the second radial bearing 4, is not sufficient for holding the rotor 1 in position during rotation in the axial direction, a counter bearing 35 (as depicted in FIG. 1) may be provided, which pushes the rotor 1 toward the axial bearing 5, in this case, at the end on the cap side, for example, with a gas flow through a nozzle outlet opening 36. The counter bearing 35 may be formed in a foldable or movable stator portion, which may be folded back or pushed aside for changing the rotor, or may be mounted, for example, screwed on with each change of rotor (not further depicted). In the embodiment shown, the counter bearing 35 is integrated in a sealing cover 37, used to seal the stator 2 once the rotor 1 is inserted; the sealing cover 37 in this case also includes air outlet openings 34a.

The stator 2 is mounted in a stator holder 32, which forms a stator bearing 41 for the stator 2, in which the stator 2 may be axially inserted and extracted (in parallel to the rotation axis RA); the inserted state is shown above and below in FIG. 1. The stator bearing 41 in this case comprises a front portion 41a, which encompasses the second bearing base 18 in the embodiment shown, and forms a radial delimitation 32a to any radial movement of the stator 2. The stator bearing 41 in this case also comprises a rear portion 41b, which encompasses the first bearing base 17 in the embodiment shown and also forms a radial delimitation 32a. The rear portion 41b also forms an axial stop 32b for the stator 2, which is abutted by a shoulder 42 of the first bearing base 17. Situated between the portions 41a, 41b of the stator bearing 41, radially directly adjoining the sheath element 16, is the RF coil arrangement 21, which is fastened in the MAS-NMR probe head assembly 200 in a manner not further depicted, for example, on the stator holder 32 (but not on the stator 2).

Grooves are provided in the portions 41a, 41b of the stator bearing 41, in which seals (sealing rings) 30, 31 are situated, in this case O-rings made of elastic material, for example, rubber. These sealing rings in this case press circumferentially on the outer sides of the second bearing base 18 and of the first bearing base 17. In this way, an evacuated space 33, which is also delimited radially inside by the sheath element 16, is sealed off. In this evacuated space 33, the RF coil arrangement 21 contained therein may be temperature-controlled with good thermal insulation, in particular, to a cryogenic temperature of, for example, 20 K.

The seals 31, 30 in the embodiment of FIG. 1 function as stationary (i.e. immobile in the stator holder 32) securing parts 61, which at the same time have the function of elastic elements 44, which brace the inserted stator 2 radially and as a result axially fix the stator in a frictional fit to the extent necessary during normal operation with respect to the forces expected in the process. By using a greater force however, the stator 2 may be extracted axially (in this case to the right), for example, for maintenance without having to disengage additional mechanisms. It should be noted that when re-inserting the stator 2 into the stator holder 32, a certain force (mechanical resistance) against the seals 31, 30 must be overcome.

A gas flow supply 38 is also connected to the stator 2, in this case, to the first bearing base 17.

Figure 2:
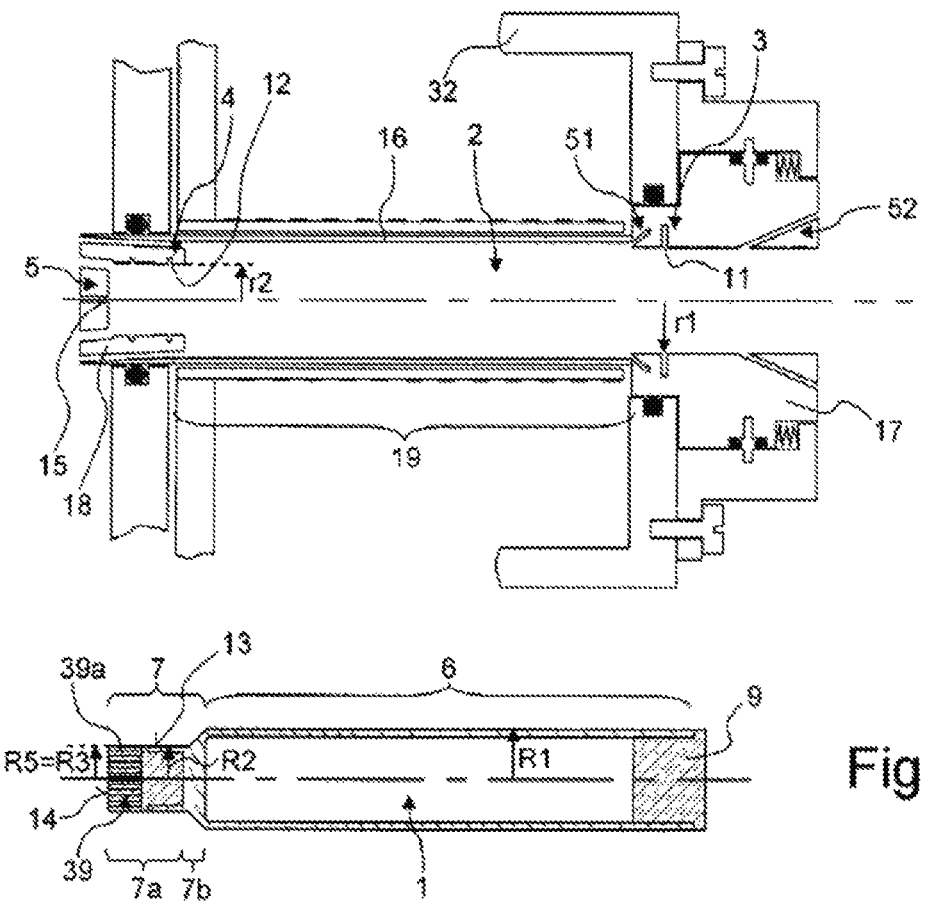
FIG. 2 schematically shows a cross section of a second embodiment of a MAS-NMR rotor according to the invention, having a largely circular cylindrically-shaped front end section. The stator comprises a sheath element, an axial bearing, two radial bearings and a drive, which is formed in the area of the front end section. The embodiment depicted herein includes an axial securing of the stator in the stator holder using spring tension. Also depicted is a RF coil arrangement comprising a coil carrier on which a RF coil is mounted.
Figure 2:
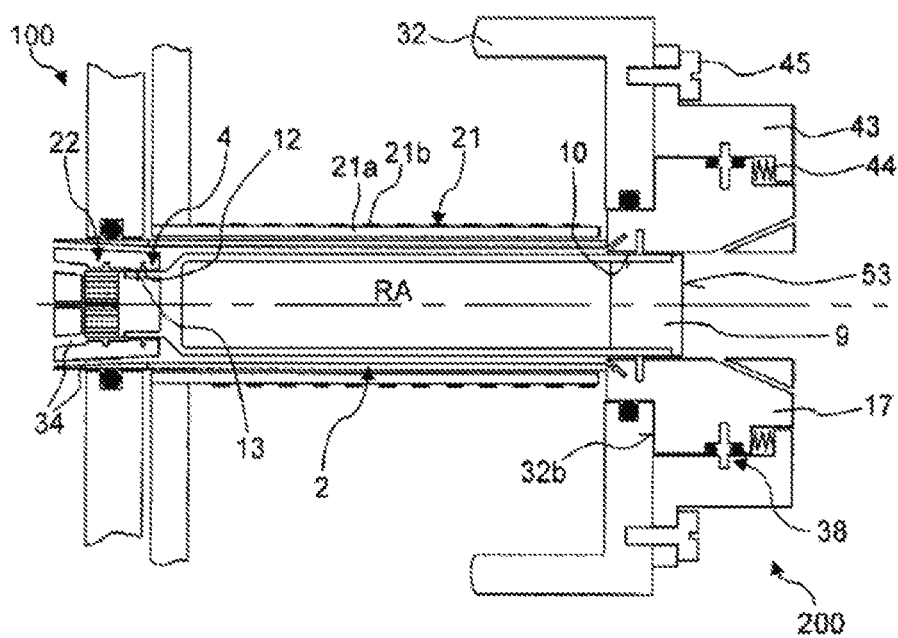

FIG. 2 shows a second embodiment of a MAS-NMR rotor system 100 according to the invention, which largely corresponds to the embodiment of FIG. 1, so that only the essential differences are depicted here. The stator 2 (with portions of a stator holder 32) is again shown above, in the middle the rotor 1, and below the MAS-NMR rotor system 100, including rotor 1 and stator 2. The MAS-NMR rotor system 100 and the stator holder 32 are part of a probe head assembly 200 for the invention.

In the embodiment shown, the rotor 1 includes an end section 7, which has a circular cylindrical shape in a front portion 7a and a conical (truncated conical) shape in a rear portion 7b, which leads to the circular cylindrically-shaped section 6. The end section 7 forms the second bearing surface 13 of the second pneumatic radial bearing 4 opposite the nozzle outlet openings 12 in the area of the circular cylindrically-shaped front portion 7a. The radius R2 of the second bearing surface 13 is identical to the radius R3 of the third bearing surface 14 of the pneumatic axial bearing 5, opposite the nozzle outlet opening 15. Both R2 as well as R3 are significantly smaller than the radius R1 of the first bearing surface 10 opposite the nozzle outlet openings 11 of the first radial bearing 3. A portion of the end section 7 in this case is formed by a cap attachment 39 of the rotor 1. Counter structures 39a, for example, impact surfaces for a drive gas flow of a drive 22 are formed on the cap attachment 39, with which the rotor 1 may be set to rotate about the rotation axis RA.

The nozzle outlet openings 12 of the second radial bearing 4, at a radius r2, are significantly smaller than the radius r1 of the nozzle outlet openings 11 of the first radial bearing 3, and also significantly smaller than the (outer) radius R1 of the cylindrically-shaped section 6, so that here, too, a very compact design is achievable, which may easily be inserted axially from the side into a RF coil arrangement 21. The RF coil arrangement 21 in this case is designed with a tubular-shaped coil carrier 21a, on the outside of which the conductor elements 21b of the RF coil arrangement 21 are situated.

In the embodiment shown, the stator 2 includes temperature control gas nozzles 51, with which a desired temperature is adjustable in the stator 2 around the rotor 1 and, as a result, in the rotor 1 as well. For example, measurement substance in the rotor 1 may be moderately cooled in order to prevent a denaturing of proteins during an NMR measurement, for example, at approximately 0°. Pressure gas nozzles 52 are also provided, with which the pressure on an impact surface 53 of the rotor 1, in this case, formed on the cap 9, may be adjusted in order to secure the axial position of the rotor 1 during the rotation about the rotation axis RA.

In this embodiment, a gas flow may be employed on the second radial bearing 4, equally high or higher than that employed on the first radial bearing 3, in order to achieve an approximately equal radial bearing stiffness. The second radial bearing 4, in particular, may be impacted with a higher pressure than the first radial bearing. If necessary, a counter bearing may also be provided in this embodiment (not depicted, but cf. FIG. 1 and FIG. 3).

A removable securing part 43 is provided in the embodiment of FIG. 2, which engages the stator 2 on the first bearing base 17 from behind. The removable securing part 43 is shown in a securing position screwed onto the stator holder 32, cf. the screws 45. The securing part 43 presses with elastic elements 44, in this case springs or alternatively elastomer elements, against the stator 2 from the rear, as a result of which the stator is fittingly attached to the axial stop 32b. Thus, the stator 2 is braced resiliently against the axial stop 32b. In order to extract the stator 2 axially from the stator holder 32 (in this case, to the right), the screws 45 may be loosened and the securing part 43 (including springs) may be removed.

It should be noted that the removable securing part 43 in this case also includes a gas flow supply 38.

The sheath tube 16 in this case includes a rear section, which would be radially longer as compared to a front section 19, in that respect, the front section 19 in this case (insertable into the RF coil arrangement) extends over the entire length of the sheath tube 16.

Figure 3:
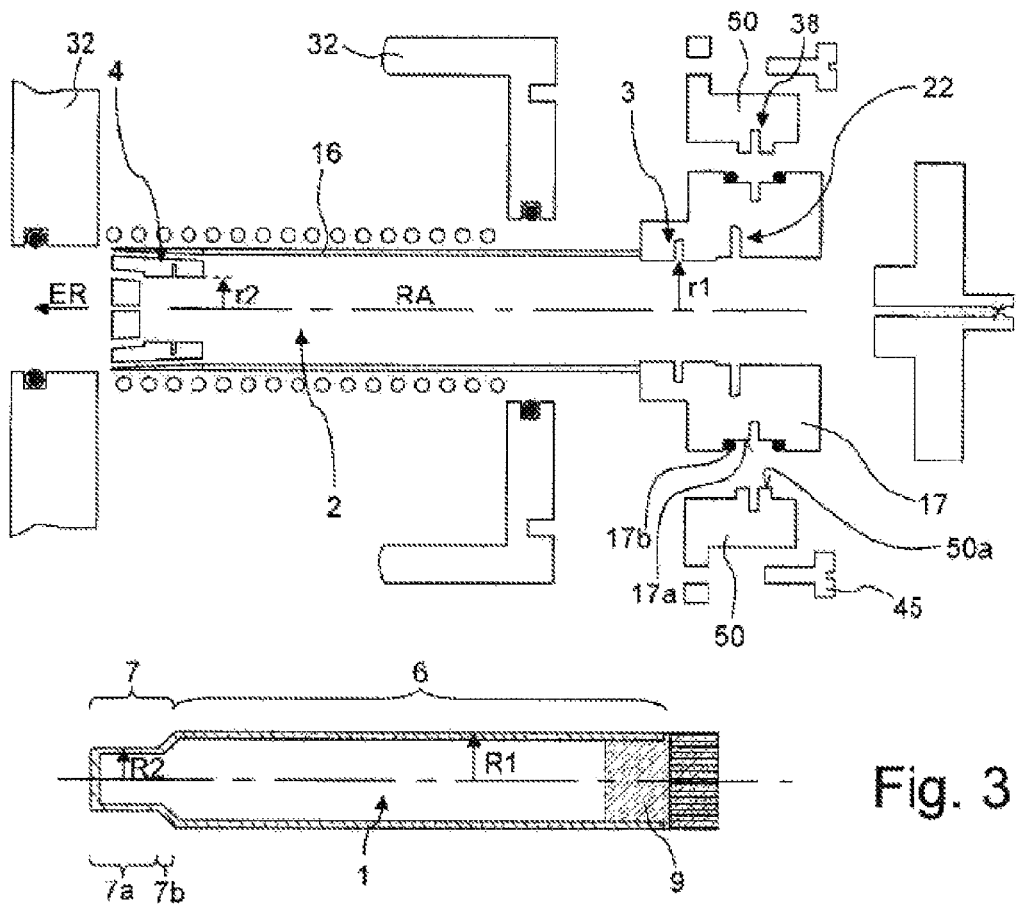
FIG. 3 schematically shows a cross section of a third embodiment of a MAS-NMR rotor system according to the invention, having a largely circular cylindrically-shaped end section. The stator comprises a sheath element, an axial bearing, two radial bearings and a drive, which is formed in the rear area of the rotor opposite the axial bearing, and includes a flow restriction of the turbine exhaust air for increasing the holding force of the rotor in the stator. The embodiment depicted herein includes an axial securing of the stator in the stator holder using the gas connection for bearings and drive.
Figure 3:
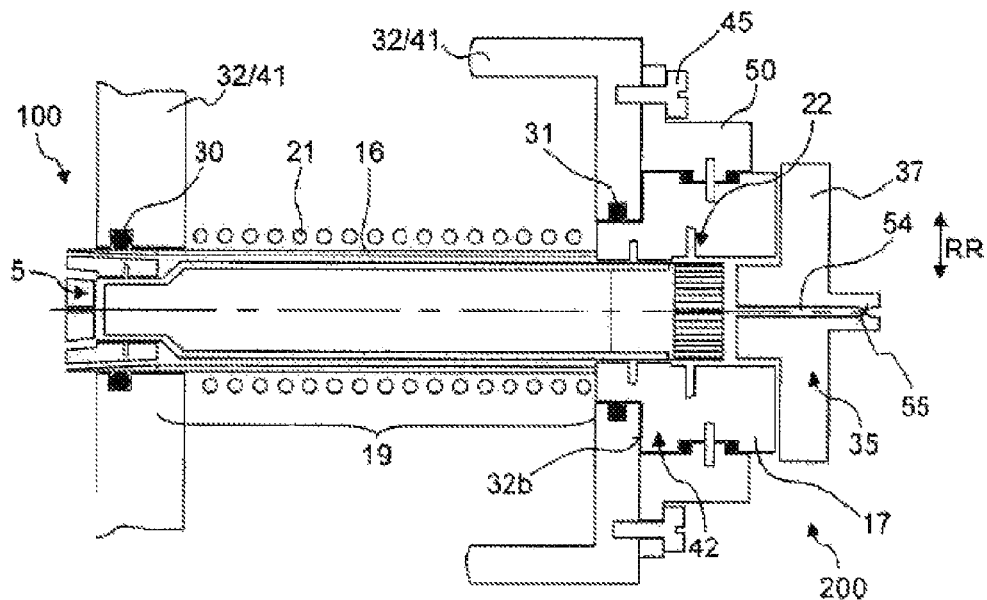

FIG. 3 shows a third embodiment of a MAS-NMR rotor system 100 according to the invention, which largely corresponds to the embodiment of FIG. 1, so that only the essential differences are depicted here. The stator 2 is again shown above, but in a state inserted only partially in the insertion direction ER into the stator holder 32, in which the securing part 50 is not yet installed. The rotor 1 is shown in the middle and the entire MAS-NMR rotor system 100, including rotor 1 and stator 2, is shown below. The MAS-NMR rotor system 100 and the stator holder 32 are part of a probe head assembly 200 for the invention.

In this design, the rotor 1 again includes an end section 7 having a circular cylindrically-shaped front portion 7a and a conical rear portion 7b (cf. FIG. 2), but without the use of a cap attachment on the front end. The pneumatic drive 22 engages a cap 9 at the rear end of the rotor 1. The sheath tube 16 in this case includes no rear section, which would be radially longer as compared to a front section 19, in that respect, the front section 19 (insertable into the RF coil arrangement 21) extends over the entire length of the sheath tube 16.

The securing part 50 (in this case, comprising multiple separate components) serves to secure the stator 2 in the stator bearing 41 in an axially fully inserted state (with respect to insertion direction ER or along the rotation axis RA) (cf. FIG. 3 below, with shoulder 42 and with axial stop 32b abutting one another), so that the stator 2 is unable to move axially during a measurement.

The securing part 50 includes lugs 50a, which are insertable in grooves 17a on the first bearing base 17. In the inserted state of the lugs 50a, the securing part 50 may be screwed onto the stator holder 32 by screws 45, cf. FIG. 3 below for the screwed-in state. The stator 2 is clamped in the radial direction RR via seals 17b press-fitted in radial direction RR, or also directly via the lugs 50a and a respective groove base of the grooves 17a. Due to frictional fit, an additional securing of the stator 2 in the axial direction in the stator bearing 41 is achieved in this way over and above the effect of the seals or seal rings 30, 31. In addition, the lugs 50a also engage the first bearing base 17 in the grooves 17a from behind relative to the axial direction, which results in an additional securing.

The securing part 50 in this case also includes the gas flow supply 38, wherein the seals 17b seal off the gas flow supply.

A counter bearing 35 is provided in this case in the sealing cover 37 by limiting the discharge of the drive air of the drive 22, so that a counter-pressure is built up, which pushes the rotor 1 toward the axial bearing 5. An adjustable gas flow limiting device is provided for this purpose in a gas outlet duct 54, in this case, a variable diaphragm 55.

Figure 4:
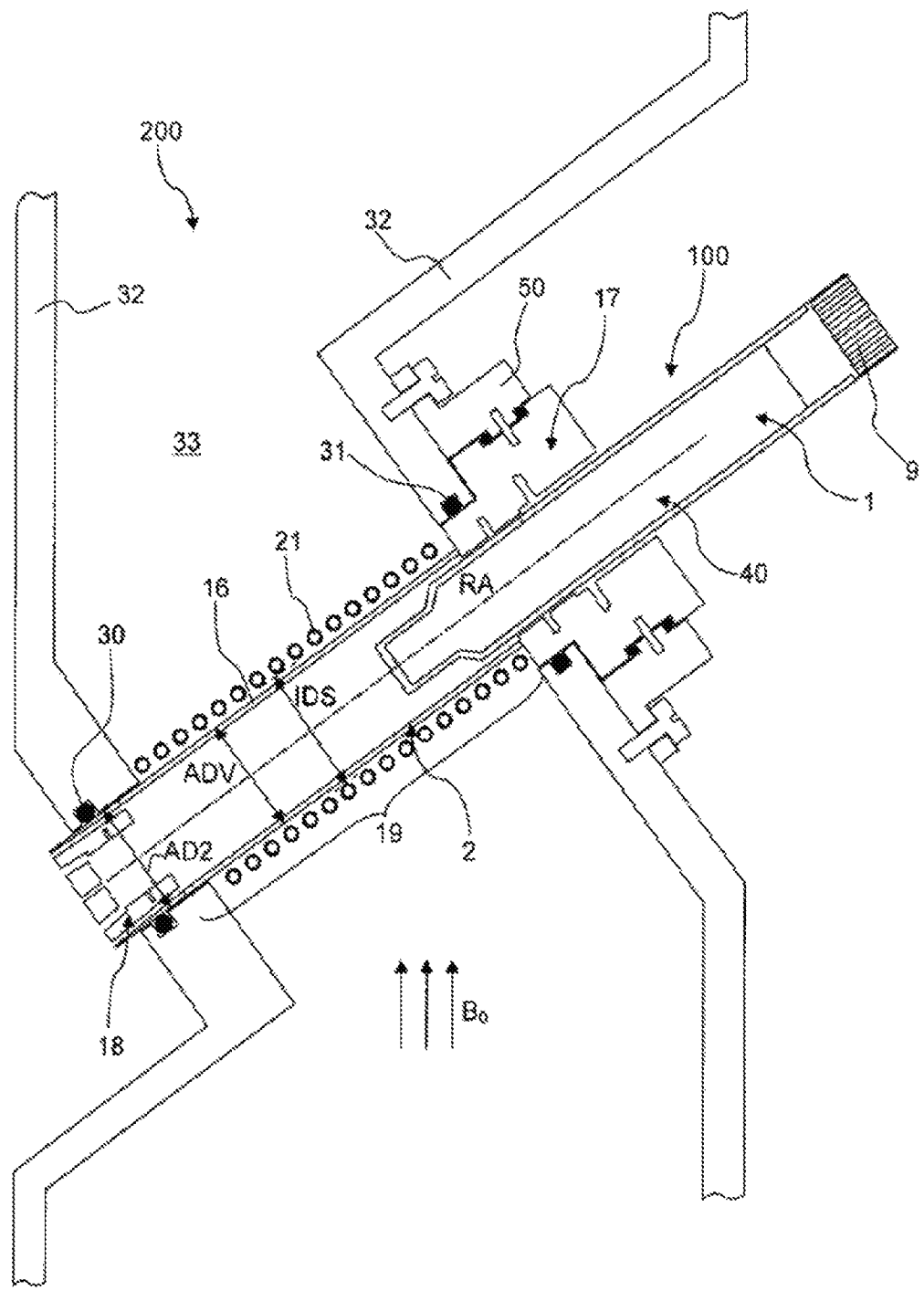
FIG. 4 schematically shows a cross section through an embodiment of a probe head assembly according to the invention, in which the stator is attached at a fixed angle in relation to the probe head assembly.

FIG. 4 shows a schematic side view of an embodiment of a probe head assembly 200 according to the invention, in which a MAS-NMR rotor system 100 has been installed, as depicted in FIG. 3.

The probe head assembly 200 comprises a stator 2, in which a rotor 1 is mounted so as to be rotatable about a rotation axis RA; the rotor 1 is just being changed in FIG. 4 and is therefore only partially axially inserted in the stator 2. The rotor 1 is sealed with a cap 9 at the rear end. The stator 2 includes two bearing bases 17, 18, which are mechanically connected via the sheath element 16.

The probe head assembly 200 includes a RF coil arrangement 21, wherein the minimum inner diameter IDS of the RF coil arrangement 21 is greater than the (maximum) outer diameter AD2 of the second bearing basis 18 and the (maximum) outer diameter ADV in a front section 19 of the sheath element 16 (which in this case comprises the entire length of the sheath element 16). In this way, the stator 2 may be guided through the RF coil arrangement 21 during assembly or for maintenance purposes when the securing part 50 is removed. In the inserted (pushed-in) state, the stator 2 is held in a stator holder 32, which is designed for a stator bearing. The mounting is designed so that the rotation axis RA is aligned at the magical angle of ≈54.7° with respect to a, in this case, vertically extending magnetic field $B_0$.

The stator 2 gas-tight radially to the outside with gas-tight sheath element 16 is sealed off in this case in the area of the bearing bases 17, 18 with seals 30, 31 with respect to the stator holder 32, so that the stator 2, respectively, the sheath element 16 also delimits a space 33; the space 33 in this case is also delimited by the stator holder 32 and by additional walls not further depicted. In this case, a vacuum is furnished in the space 33, which also contains the RF coil arrangement 21, in order to thermally insulate the RF coil arrangement 21. In this way, it is possible to cool the RF coil arrangement 21 during a MAS-NMR measurement to a cryogenic temperature (for example, 77 K, corresponding to liquid nitrogen at normal pressure or while cooling, for example, with liquid or gaseous helium, also lower temperatures, in particular, ≤40 K, ≤20 K or even in the range of around 4.2 K, corresponding to liquid helium at normal pressure), while the measurement substance 40 in the rotor 1 remains at a temperature near room temperature or may be temperature-controlled to a temperature in the range of −250° C. to +1000° C., in particular, from −50° C. to +150° C. and particularly preferably in a temperature range of 0° C. to +50° C.

The rotor 1 rotates in the stator 2 during the measurement about the rotation axis RA, typically at a frequency of 10 kHz or more, in particular, at rotational speeds in the range of 1 kHz to $v_s/(2\pi R1)$, wherein $v_s$ is the sound velocity of the gas surrounding the rotor 1 under existing pressure/temperature conditions, and the RF coil arrangement 21 irradiates RF pulses into the measurement substance 40 in the rotor 1 and/or receives RF signals from the measurement substance 40. In the process, the strong static magnetic field $B_0$ acts on the measurement substance 40 (with vertical alignment in FIG. 4).

All gas flows are preferably directed out at both ends of the axially removable stator 2, so that it may be easily collected and returned. This is advantageous, in particular, for lower temperature MAS, in order not lose this in the interior air during operation with He-gas. The gas is preferably transferred to a Dewar, so that it does not heat up unnecessarily and an encapsulated gas circulation becomes possible, which needs only to compensate for (after-cooling) the conduction losses and the friction in the rotor system 100. The after-cooling takes place preferably with heat exchangers and by compression of the gas at room temperature (not further depicted).

It is also advantageous to collect the gas flows at both ends of the stator 2, in the event the MAS-NMR probe assembly 200 is used with toxic, carcinogenic, explosive, radioactive or biohazardous measurement samples.

LIST OF REFERENCE NUMERALS 1 rotor
2 stator
3 first pneumatic radial bearing
4 second pneumatic radial bearing
5 pneumatic axial bearing
6 circular cylindrically-shaped section
7 end section
7a front portion (end section)
7b rear portion (end section)
8 opening
9 cap
9a counter structures
10 first bearing surface
11 nozzle outlet openings (first radial bearing)
12 nozzle outlet openings (second radial bearing)
13 second bearing surface
14 third bearing surface
15 nozzle outlet openings (axial bearing)
16 sheath element
17 first bearing base
17a grooves
17b seals
18 second bearing base
19 front section
20 rear section
21 RF coil arrangement
21a coil carrier
21b conductor elements
22 pneumatic drive
30, 31 seals
32 stator holder
32a radial delimitation
32b axial stop
33 evacuated space
34 air outlet openings
34a air outlet openings (counter bearings)
35 counter bearings
36 nozzle outlet openings (counter bearings)
37 sealing cover
38 gas flow supply
39 cap attachment
40 measurement substance
41 stator bearing
41a front portion (stator bearing)
41b rear portion (stator bearing)

42 shoulder
43 axial rear-engaging securing part
44 elastic element
45 screw
50 movable securing part
50a lugs
52 compressed gas nozzles
53 impact surface
54 gas outlet duct
55 variable diaphragm
61 stationary securing part
100 MAS-NMR rotor system
200 probe head assembly
AD1 outer diameter (first bearing base)
AD2 outer diameter (second bearing base)
ADV outer diameter front section
ADH outer diameter rear section
ER insertion direction
IDS minimum inner diameter (RF coil arrangement)
R1 radius (first bearing surface)
R2 radius (second bearing surface)
R3 outer radius (third bearing surface)
R4 radius (cap)
R5 radius (cap attachment)
r1 radius (nozzle outlet openings first radial bearing)
r2 radius (nozzle outlet openings second radial bearing)
RA rotation axis
RR radial direction

What is claimed is:

1. A magic angle spinning (MAS) nuclear magnetic resonance (NMR) rotor system, comprising:
    a rotor configured to accommodate a measurement substance,
    a stator configured to mount the rotor rotatably about a rotation axis,
    a first pneumatic radial bearing, comprising first nozzle outlet openings in the stator at a radius r1 and a first bearing surface on a circular cylindrically-shaped section of the rotor at a radius R1,
    a second pneumatic radial bearing, comprising second nozzle outlet openings in the stator at a radius r2 and a second bearing surface on the rotor at a radius R2, and
    a pneumatic axial bearing, comprising at least one nozzle outlet opening in the stator and a third bearing surface on an axial end of the rotor,
    wherein the third bearing surface runs orthogonally to the rotation axis and has an outer radius R3,
    wherein the second pneumatic radial bearing is formed on an end section of the rotor which, as compared to the circular cylindrically-shaped section, has a smaller radius or a radius that decreases away from the circular cylindrically-shaped section, such that: R2<R1 and r2<r1, and
    wherein the third bearing surface is formed on an end of the end section that faces away from the circular cylindrically-shaped section, such that: R3≤R2.

2. The rotor system according to claim 1, wherein the end section is at least partially circularly cylindrical in shape.

3. The rotor system according to claim 1, wherein the end section is at least partially truncated conical in shape.

4. The rotor system according to claim 3, wherein the end section runs at least partially at an angle α relative to the rotation axis, where 15°≤α≤45°.

5. The rotor system according to claim 1, wherein the stator encompasses the third bearing surface and at least an adjoining portion of the end section in a cup-shaped manner, and wherein air outlet openings are provided in the stator in an area of the third bearing surface and/or of the end section.

6. The rotor system according to claim 5, wherein the stator encompasses an entirety of the end section.

7. The rotor system according to claim 1, wherein the end section extends over no more than ¼ of the length of the rotor and/or extends at least over 1/20 of the length of the rotor.

8. The rotor system according to claim 1, wherein the rotor) includes an opening at an end that faces away from the third bearing surface and is configured for filling the rotor with the measurement substance, and wherein the rotor includes a cap, which seals the opening of the rotor.

9. The rotor system according to claim 8, wherein counter structures are formed on the cap as a pneumatic drive for the rotor.

10. The rotor system according to claim 9, wherein the pneumatic drive comprises at least one of: impact surfaces, wing surfaces or spiral grooves.

11. The rotor system according to claim 8, wherein an outer radius R4 of the cap corresponds at least substantially to the radius R1.

12. The rotor system according to claim 8, wherein the circular cylindrically-shaped section extends from the end section to the opening.

13. The rotor system according to claim 1, wherein the rotor is closed in an area of the third bearing surface.

14. The rotor system according to claim 1, further comprising a counter bearing,
    which lies opposite the axial bearing.

15. A probe head assembly, comprising:
    a rotor system according to claim 1,
    a RF coil arrangement configured to irradiate RF pulses into the measurement substance in the rotor and/or to receive RF signals from the measurement substance in the rotor,
    wherein the stator includes a first bearing base, comprising a portion of the first radial bearing on the stator, a sheath element and a second bearing base, comprising a portion of the second radial bearing on the stator,
    wherein the sheath element connects the first bearing base and the second bearing base to one another,
    wherein the sheath element includes a front section, which connects to the second bearing base and has a maximum outer diameter ADV,
    wherein the second bearing base has a maximum outer diameter AD2,
    wherein the stator has a maximum outer diameter AD1 in an area of the first radial bearing, and
    wherein the RF coil arrangement has a minimum diameter IDS,
    such that: AD1>IDS
        ADV<IDS and
        AD2<IDS.

16. The probe head assembly according to claim 15, wherein the sheath element is gas-tight.

17. The probe head assembly according to claim 16,
    wherein the RF coil arrangement is situated in an evacuated space, which is delimited by the sheath element, and/or
    wherein the RF coil arrangement is cooled to a cryogenic temperature T≤100 K.

18. A method for measuring a measurement substance, comprising:
    providing a probe head assembly according to claim 15,
    arranging the rotor in the stator, and rotating the rotor about the rotation axis at a frequency of at least 1 kHz.

19. The method according to claim 18, further comprising:
selecting a gas flow on the first radial bearing and a gas flow on the second radial bearing such that an at least approximately equal bearing stiffness is achieved for the first radial bearing and the second radial bearing.

* * * * *